(12) United States Patent
Takaishi

(10) Patent No.: US 7,939,884 B2
(45) Date of Patent: May 10, 2011

(54) SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 599 days.

(21) Appl. No.: 11/922,092

(22) PCT Filed: Jun. 7, 2006

(86) PCT No.: PCT/JP2006/311420
§ 371 (c)(1),
(2), (4) Date: Dec. 13, 2007

(87) PCT Pub. No.: WO2006/134810
PCT Pub. Date: Dec. 21, 2006

(65) Prior Publication Data
US 2009/0302379 A1      Dec. 10, 2009

(30) Foreign Application Priority Data

Jun. 14, 2005  (JP) .................................. 2005-173243

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/330; 257/328; 257/408; 257/329

(58) Field of Classification Search .................. 257/330, 257/302, 328, 332, 202, 331, 329, 346, 408, 257/520, 513
See application file for complete search history.

(56) References Cited

U.S. PATENT DOCUMENTS 3,709,860 A    1/1973  Fischer et al. ............... 260/77.5
(Continued)

FOREIGN PATENT DOCUMENTS

EP    0 580 452 A1    1/1994
(Continued)

OTHER PUBLICATIONS

Mino, N. et al.; "Photoreactivity of 10,12-Pentacosadiynoic Acid Monolayers and Color Transitions of the Polymerized Monolayers on an Aqueous Subphase"; Langmuir 1992, vol. 8, p. 594-598.

(Continued)

*Primary Examiner* — Chuong A. Luu
(74) *Attorney, Agent, or Firm* — Rabin & Berdo, PC

(57) ABSTRACT

A trench semiconductor device is provided which ensures a reduced turn-on time. The semiconductor device (1) includes: a first epitaxial layer provided on a semiconductor substrate; a second epitaxial layer provided in contact with an upper surface of the first epitaxial layer and having a lower impurity concentration than the first epitaxial layer; a plurality of trenches provided in the second epitaxial layer as extending downward from an upper surface of the second epitaxial layer; a gate electrode embedded in each of the trenches; a source region extending downward from the upper surface of the second epitaxial layer along each of opposite side surfaces of the trench; a base region extending downward from a lower surface of the source region along each of the opposite side surfaces of the trench; and a base high concentration region provided adjacent the source region and the base region in spaced relation from the trench as extending downward from the upper surface of the second epitaxial layer to a greater depth than the base region, and having the same conductivity type as the base region and a higher impurity concentration than the base region.

3 Claims, 5 Drawing Sheets

U.S. PATENT DOCUMENTS

| | | | |
|---|---|---|---|
| 3,999,946 A | 12/1976 | Patel et al. ............... | 23/253 |
| 4,215,208 A | 7/1980 | Yee et al. ............... | 526/285 |
| 4,238,352 A | 12/1980 | Patel et al. ............... | 252/408 |
| 4,242,440 A | 12/1980 | Yee et al. ............... | 430/346 |
| 4,389,217 A | 6/1983 | Baughman et al. ............... | 436/2 |
| 4,708,019 A | 11/1987 | Rubner et al. ............... | 73/760 |
| 4,721,769 A | 1/1988 | Rubner ............... | 528/75 |
| 4,767,826 A | 8/1988 | Liang et al. ............... | 525/421 |
| 4,849,500 A | 7/1989 | Rubner ............... | 528/345 |
| 4,916,211 A | 4/1990 | Rubner ............... | 528/480 |
| 5,156,810 A | 10/1992 | Ribi ............... | 422/82.01 |
| 5,387,528 A | 2/1995 | Hutchings et al. | |
| 5,491,097 A | 2/1996 | Ribi et al. ............... | 436/518 |
| 5,554,686 A | 9/1996 | Frisch, Jr. et al. ............... | 524/588 |
| 5,558,313 A | 9/1996 | Hshieh et al. | |
| 5,571,568 A | 11/1996 | Ribi et al. ............... | 427/487 |
| 5,622,872 A | 4/1997 | Ribi ............... | 436/518 |
| 5,672,465 A | 9/1997 | Patel et al. ............... | 430/332 |
| 5,674,766 A * | 10/1997 | Darwish et al. ............... | 438/270 |
| 5,685,641 A | 11/1997 | Ribi ............... | 374/162 |
| 5,692,937 A | 12/1997 | Zhang ............... | 442/149 |
| 5,770,878 A * | 6/1998 | Beasom ............... | 257/330 |
| 5,895,952 A | 4/1999 | Darwish et al. | |
| 5,929,160 A | 7/1999 | Krepski et al. ............... | 524/590 |
| 6,103,217 A | 8/2000 | Charych ............... | 424/9.321 |
| 6,368,920 B1 | 4/2002 | Beasom | |
| 6,518,359 B1 | 2/2003 | Clemens et al. ............... | 524/840 |
| 6,607,744 B1 | 8/2003 | Ribi ............... | 424/439 |
| 6,642,304 B1 | 11/2003 | Hansen et al. ............... | 524/590 |
| 6,963,007 B2 | 11/2005 | Hays et al. ............... | 558/333 |
| 2004/0126897 A1 | 7/2004 | Prince et al. ............... | 436/518 |
| 2004/0132217 A1 | 7/2004 | Prince et al. ............... | 436/518 |
| 2005/0082604 A1 | 4/2005 | Yoshimochi | |
| 2005/0137375 A1 | 6/2005 | Hansen et al. ............... | 528/44 |
| 2006/0041057 A1 | 2/2006 | Koecher et al. ............... | 525/50 |
| 2006/0134796 A1 | 6/2006 | Bommarito et al. ............... | 436/166 |

FOREIGN PATENT DOCUMENTS

| | | |
|---|---|---|
| EP | 0 720 236 A2 | 7/1996 |
| JP | 2-144971 | 6/1990 |
| JP | 2144971 | 6/1990 |
| JP | 6209013 | 7/1994 |
| JP | 8250731 | 9/1996 |
| JP | 10-032335 | 2/1998 |
| JP | 2001-203353 | 7/2001 |
| WO | WO 96/25665 A1 | 8/1996 |
| WO | WO 97/27316 A1 | 7/1997 |
| WO | WO 98/04743 A1 | 2/1998 |
| WO | WO 98/36263 A1 | 8/1998 |
| WO | WO 98/39632 A1 | 9/1998 |
| WO | WO 99/10743 A1 | 3/1999 |
| WO | WO 99/67423 A1 | 12/1999 |
| WO | WO 02/00920 A2 | 1/2002 |

OTHER PUBLICATIONS

Chance, R.R. et al.; "Thermal effects on the optical properties of single crystals and solution-cast films of urethane substituted polydiacetylenes"; J. Chem. Phys. vol. 71(1), Jul. 1, 1979, p. 206-211.

Shibata, M.; "Reversible Colour Phase Transitions and Annealing Properties of Langmuir-Blodgett Polydiacetylene Films"; Thin Solid Films; vol. 179 (1989) p. 433-437.

Kaneko, F. et al.; "Absorption properties and structure changes caused by pre-annealing in polydiacetylene Langmuir-Blodgett films"; Thin Solid Films; vol. 210/211 (1992) p. 548-550.

Rubner, M.F.; "Synthesis and Characterization of Polyurethane-Diacetylene Segmented Copolymers"; Macromolecules 1986, vol. 19, p. 2114-2128.

Rubner, M.F.; "Novel Optical Properties of Polyurethane-Diacetylene Segmented Copolymers"; Macromolecules 1986, vol. 19, p. 2129-2138.

Nallicheri, R.A. et al.; "Thermal and Mechanical Properties of Polyurethane-Diacetylene Segmented Copolymers. 1. Molecular Weight and Annealing Effects"; Macromolecules 1990; vol. 23, p. 1005-1016.

Nallicheri, R.A. et al.; "Thermal and Mechanical Properties of Polyurethane-Diacetylene Segmented Copolymers. 2. Effects of Diacetylene Cross-Polymerization"; Macromolecules 1990; vol. 23, p. 1017-1025.

Hammond, P.T. et al.; "Thermochromism in Liquid Crystaline Polydiacetylenes"; Macromolecules 1997; vol. 30, p. 5773-5782.

Oertel, G. (Editor); "Polyurethane, Kunststoff Handbuch 7"; 1983; p. 22-24.

Zorll, U. (Editor); "RÖMPP Lexikon—Lacke und Druckfarben"; 1998; p. 467.

Siemsen, P. et al.; "Acetylenic Coupling: A Powerful Tool in Molecular Construction"; Angewandte Chemie International Edition; 2000; vol. 390 (15); p. 2632-2657.

Valverde, C. et al.; "Some Novel Photosensitive Diactylene Diurethanes and Their Mixtures in Common Polymers"; Polymers for Advanced Technologies; vol. 7, pp. 27-30 (1996).

Miller, J.A. et al.; "Properties of Polyether-Polyurethane Block Copolymers: Effects of Hard Segment Length Distribution"; Macromolecules; 1985; vol. 18, pp. 32-44.

* cited by examiner

SEMICONDUCTOR DEVICE

TECHNICAL FIELD

The present invention relates to a semiconductor device and, particularly, to a semiconductor device including a MOSFET configured along side surfaces of trenches.

BACKGROUND ART

In recent years, there has been an increasing demand for a semiconductor device including a MOSFET configured along side surfaces of trenches (hereinafter referred to as "trench semiconductor device"), because this semiconductor device has a lower ON resistance than a semiconductor device including a MOSFET (planar DMOSFET (double diffused MOSFET)) configured along an upper surface of an epitaxial layer.

A conventional trench semiconductor device is shown in FIG. 4. The semiconductor device 101 includes an N⁻ type epitaxial layer 111 provided on an upper surface of an N type semiconductor substrate 110. A plurality of trenches (grooves) 120 are provided in the epitaxial layer 111 as extending downward from an upper surface of the epitaxial layer 111. A MOSFET is configured along opposite side surfaces of the trenches 120.

That is, a gate electrode 121 is embedded in each of the trenches, and an N⁺ type source region 113 and a P⁻ type base region 114 are arranged in this order toward a lower side along each of the opposite side surfaces of the trenches 120. A portion of the epitaxial layer 111 below the base region 114 serves as an N⁻ type drain region 115. A base high concentration region 116 is provided adjacent the source region 113 and the base region 114 in spaced relation from the trench 120 as extending downward from the upper surface of the epitaxial layer 111. The base high concentration region 116 has the same conductivity type as the base region 114 and a higher impurity concentration than the base region 114, and is shallower than the base region 114. The base high concentration region 116 has an ohmic contact with a source electrode 125 to be described later, and reduces the resistance component of the base region 114.

A gate insulating film 122 of a thin silicon oxide film is provided between the trench 120 and the gate electrode 121. The gate insulating film 122 extends onto the upper surface of the epitaxial layer 111. Further, an interlayer insulating film 123 is provided on the gate electrode and the gate insulating film 22 as partly covering the upper surface of the epitaxial layer 111. The gate insulating film 122 and the interlayer insulating film 123 each have an etched-off portion serving as a contact hole 124 on a part of the source region 113 and an upper surface of the base high concentration region 116. A metal layer is provided as the source electrode 125 to provide electrical contacts to the source region 113 and the base high concentration region 116 through the contact hole 124.

Where the semiconductor device 101 is in an OFF state, depletion layers 140 and 141 are formed as respectively spreading from lower surfaces of the base region 114 and the trench 120 into the drain region 115 in the epitaxial layer 111 as shown in FIG. 5. The depletion layer 140 spreading from the base region 114 has a relatively great width, while the depletion layer 141 spreading from the lower surface of the trench 120 has a relatively small width. A gate-drain capacitance CGD which is a capacitance between the gate electrode 121 and the drain region 115 is generally equal to a capacitance provided by serially coupling the capacitance of the gate insulating film 122 with the capacitance of the depletion layer 141 formed below the lower surface of the trench 120. The value of the capacitance of the depletion layer 141 is inversely proportional to the width of the depletion layer 141. Therefore, the depletion layer 141, if having a smaller width, has a greater capacitance value, resulting in a greater gate-drain capacitance CGD. Conversely, the depletion layer 141, if having a greater width, has a smaller capacitance value, resulting in a smaller gate-drain resistance CGD.

Patent Document 1: Japanese Unexamined Patent Publication No. 8-250731

DISCLOSURE OF THE INVENTION

Problems to be Solved by the Invention

Meanwhile, in Japanese Patent Application No. 2005-115952 filed in Japanese Patent Office, the inventor of the present invention previously proposes a semiconductor device having a planar DMOSFET which ensures a reduced turn-on time to achieve a higher speed switching capability. According to the previous patent application, the gate-drain capacitance CGD can be reduced by controlling the orientation and the width of a depletion layer in an OFF state. As a result, the turn-on time is reduced.

The inventor of the present invention has come up with an idea that, if the art of the previous patent application is modified to be applied to a trench semiconductor device, it is possible to achieve a further higher speed switching capability with a reduced turn-on time and a lower ON resistance, and accomplished the present invention.

In view of the foregoing, it is an object of the present invention to provide a trench semiconductor device which ensures a reduced turn-on time.

Means for Solving the Problems

A semiconductor device according to the present invention includes: a first epitaxial layer provided on a semiconductor substrate; a second epitaxial layer provided in contact with an upper surface of the first epitaxial layer and having a lower impurity concentration than the first epitaxial layer; a plurality of trenches provided in the second epitaxial layer as extending downward from an upper surface of the second epitaxial layer; a gate electrode embedded in each of the trenches; a source region extending downward from the upper surface of the second epitaxial layer along each of opposite side surfaces of the trench; a base region extending downward from a lower surface of the source region along each of the opposite side surfaces of the trench; and a base high concentration region provided adjacent the source region and the base region in spaced relation from the trench as extending downward from the upper surface of the second epitaxial layer to a greater depth than the base region, and having the same conductivity type as the base region and a higher impurity concentration than the base region.

An interlayer insulating film may be provided on the gate electrode as covering a part of the upper surface of the second epitaxial layer, and a source electrode may be provided in contact with the interlayer insulating film, a part of the source region and an upper surface of the base high concentration region.

Alternatively, a buried insulating film may be provided on the gate electrode to fill the trench to the vicinity of an opening edge of the trench, and a source electrode may be provided in contact with the buried insulating film, the source region and an upper surface of the base high concentration region.

According to the inventive semiconductor device, depletion layers spreading from base high concentration regions disposed on the opposite sides of the trench are merged with each other at a position below the trench when the semiconductor device is in an OFF state. As a result, a gate-drain capacitance CGD is reduced, thereby reducing a turn-on time.

The foregoing and other objects, features and effects of the present invention will become more apparent from the following description of the preferred embodiments with reference to the attached drawings.

BEST MODE FOR CARRYING OUT THE INVENTION

The best mode for carrying out the invention will hereinafter be described with reference to the drawings.

Figure 1:
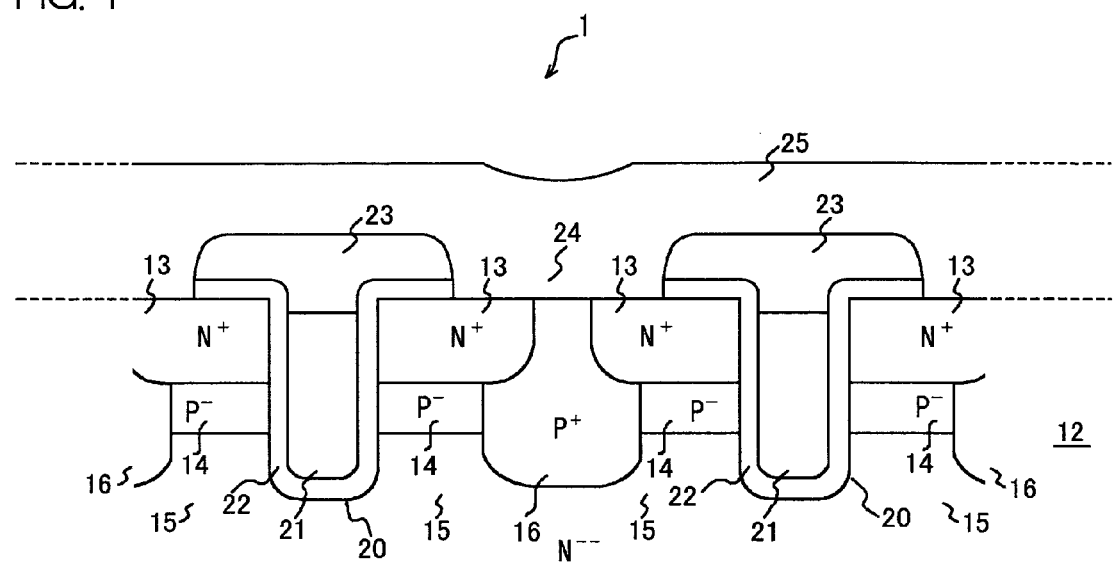
FIG. 1 is a sectional view of a semiconductor device according to a preferred embodiment of the present invention.

FIG. 1 is a sectional view of a semiconductor device according to a preferred embodiment of the present invention. The semiconductor device 1 includes an N⁻ type first epitaxial layer 11 provided on an N type semiconductor substrate 10 (for example, having an impurity concentration of about $10^{19}/cm^3$) and having the same conductivity type as the semiconductor substrate 10 and a lower impurity concentration (e.g., an impurity concentration of about $10^{16}/cm^3$) than the semiconductor substrate 10, and an N⁻⁻ type second epitaxial layer 12 provided in contact with an upper surface of the first epitaxial layer 11 and having the same conductivity type as the first epitaxial layer 11 and a lower impurity concentration (e.g., an impurity concentration of about $10^{15}/cm^3$) than the first epitaxial layer 11. That is, the semiconductor device 101 described in BACKGROUND ART is of a single epitaxial layer structure including the epitaxial layer 111, but the semiconductor device 1 is of a double epitaxial layer structure obtained by forming the second epitaxial layer 12 on the upper surface of the first epitaxial layer 11 which corresponds to the epitaxial layer 111.

A plurality of trenches 20 are provided in the second epitaxial layer 12 as extending downward from an upper surface of the second epitaxial layer 12. A MOSFET is configured along opposite side surfaces of the trenches 20. That is, a gate electrode 21 is embedded in each of the trenches 20. Provided along each of the opposite side surfaces of the trench are an N⁺ type source region 13 extending downward from the upper surface of the second epitaxial layer 12 and a P⁻ type base region 14 extending downward from a lower surface of the source region 13. A portion of the epitaxial layer 12 below the base region 14 and a base high concentration region 16 to be described later serves as an N⁻⁻ type drain region 15. The base high concentration region 16 is disposed adjacent the source region 13 and the base region 14 in spaced relation from the trench 20 as extending downward from the upper surface of the second epitaxial layer 12. The base high concentration region 16 has the same conductivity type as the base region 14 and a higher impurity concentration than the base region 14, and is formed as extending to a greater depth than the base region 14, and to have a depth that is smaller than a depth of the trenches 20. The base high concentration region 16 has an ohmic contact with a source electrode 25 to be described later, and reduces the resistance component of the base region 14. As will be described later, the base high concentration region 16 has an important function for reducing a gate-drain capacitance CGD when the semiconductor device 1 is in an OFF state.

Thus, the source region 13, the base region 14 and the base high concentration region 16 are provided in a portion of the second epitaxial layer 12, and the rest of the second epitaxial layer 12 serves as the drain region 15. The first epitaxial layer 11 provided below the second epitaxial layer 12 in contact with the drain region 15 also serves as a part of the drain region. As will be described later, the second epitaxial layer 12 (drain region 15) has a low impurity concentration such that, when the semiconductor device is in the OFF state, depletion layers respectively spreading from base high concentration regions 16 disposed on opposite sides of each trench 20 are merged with each other at a position below the trench 20.

As in the semiconductor device 101 described in BACKGROUND ART, a gate insulating film 22 of a thin silicon oxide film is provided between the trench 20 and the gate electrode 21. The gate insulating film 22 extends onto the upper surface of the second epitaxial layer 12. Further, an interlayer insulating film 23 is provided over the gate electrode 21 and the gate insulating film 22 as covering a part of the upper surface of the second epitaxial layer 12. The gate insulating film 22 and the interlayer insulating film 23 each have an etched-off portion serving as a contact hole 24 on a part of the source region 13 and an upper surface of the base high concentration region 16. A metal layer is provided as a source electrode 25 to provide electrical contacts to the source region 13 and the base high concentration region 16 through the contact hole 24. Therefore, the source electrode 25 (mechanically) contacts the interlayer insulating film 23, the part of the source region 13 and the upper surface of the base high concentration region 16.

Although a production method for the semiconductor device 1 will not be described, features of the production method are that the first epitaxial layer 11 is formed on the semiconductor substrate 10 by an epitaxial technique, that the second epitaxial layer 12 is formed on the first epitaxial layer 11 by an epitaxial technique, and that the base high concentration region 16 is formed as extending to a greater depth than the base region 41 by an impurity diffusion technique or an impurity implantation technique.

Next, ON and OFF states of the semiconductor device 1 will be described. The semiconductor device 1 is in the ON state when a gate-source voltage VGS which is a voltage between the gate electrodes 21 and the source electrode 25 is not less than a threshold, and is in the OFF state when the gate-source voltage VGS is less than the threshold. In the ON state, channel layers are formed in the base regions 14, so that ON electric current flows from the semiconductor substrate 10 to the source electrode 25 through the first epitaxial layer 11, the drain region 15, the base regions 14 and the source regions 13. As a result, a drain-source voltage VDS which is a voltage between the semiconductor substrate 10 and the source electrode 25 is generally reduced.

Figure 2:
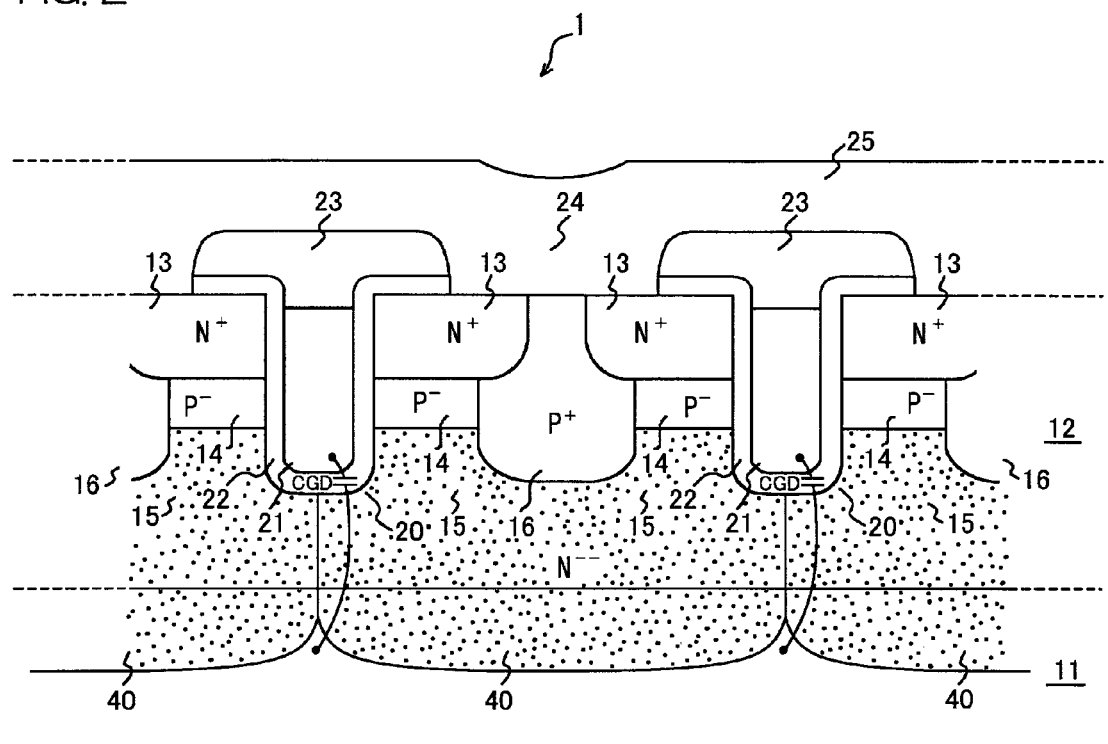
FIG. 2 is a sectional view illustrating an OFF state of the semiconductor device.

In the OFF state, on the other hand, the drain-source voltage VDS is higher (e.g., 20V), so that the depletion layers 40 occur as shown in FIG. 2. It should be herein noted that the base high concentration region 16 is formed as having a greater depth and a higher impurity concentration than the base region 14 and, therefore, a depletion layer 40 spreading depthwise and laterally from the base high concentration region 16 fills the drain region 15 having a very low impurity concentration to extend into an inner portion of the first epitaxial layer 11. That is, the depletion layers 40 spreading from the base high concentration regions 16 disposed on the opposite sides of each trench 20 are merged with each other below the trench 20. Depletion layers spreading from lower surfaces of the base region 14 and the trench 20 are completely contained in and integrated with the depletion layers 40 widely spreading from the base high concentration regions 16.

Therefore, a portion of the depletion layer 40 present below the lower surface of the trench 20 has a greater width, so that the depletion layer portion has a smaller capacitance value. Since the gate-drain capacitance CGD is equal to a capacitance obtained by serially coupling the capacitance of the gate insulating film 22 and the capacitance of the depletion layer portion formed below the lower surface of the trench 20 as described above, the gate-drain capacitance CGD is reduced. As a result, the semiconductor device 1 has a reduced turn-on time, thereby achieving higher speed switching.

In this case, as a distance from the lower surface of the trench 20 to the upper surface of the first epitaxial layer 11 increases, the width of the depletion layer portion present below the lower surface of the trench 20 is increased and, therefore, the gate-drain capacitance CGD is reduced. However, it should be noted that the drain region 15 in the second epitaxial layer 12 has a higher resistivity. Therefore, if the distance from the lower surface of the trench 20 to the upper surface of the first epitaxial layer 11 is increased, the semiconductor device 1 is liable to have an increased ON resistance in the ON state. Therefore, it is necessary to determine the distance from the lower surface of the trench 20 to the upper surface of the first epitaxial layer 11 so that the resulting ON resistance is within a permissible range.

Figure 3:
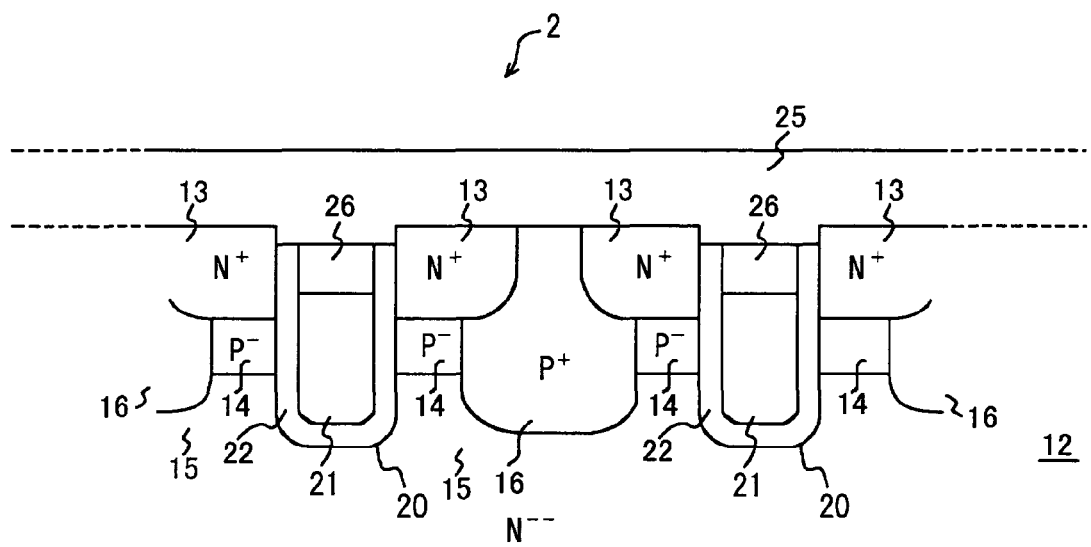
FIG. 3 is a sectional view of a semiconductor device according to another preferred embodiment of the present invention.
Figure 4:
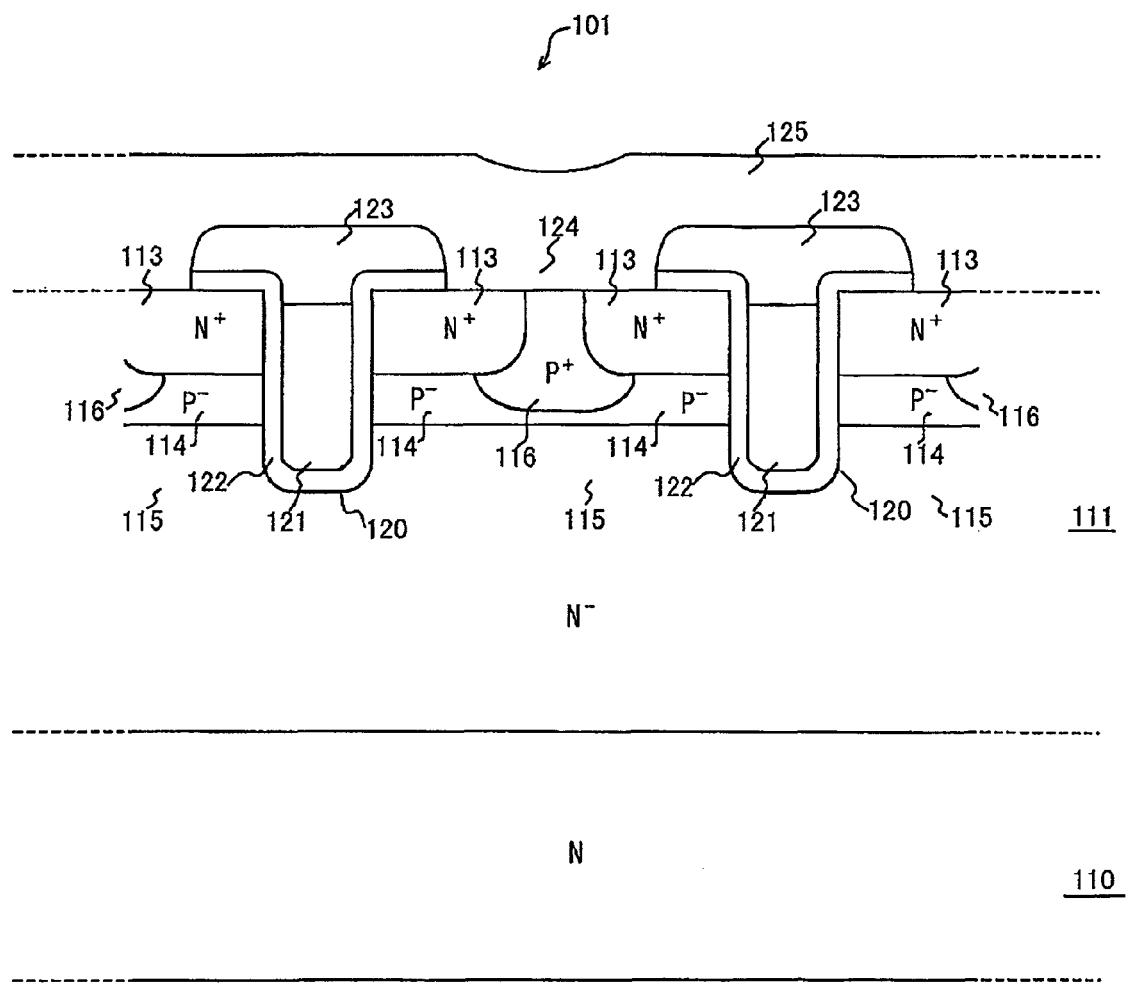
FIG. 4 is a sectional view of a conventional semiconductor device.
Figure 5:
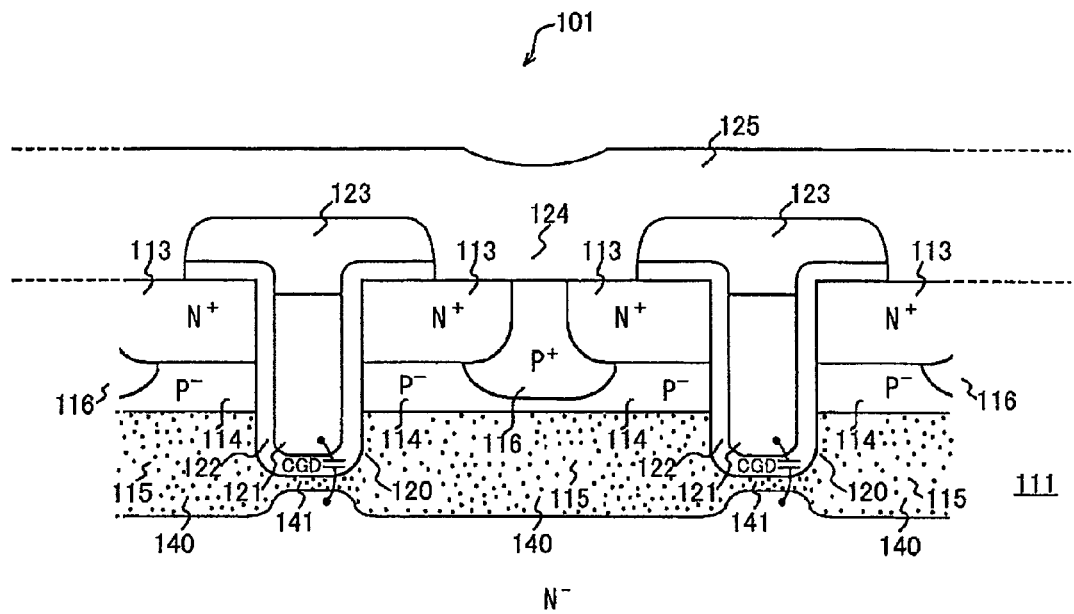
FIG. 5 is a sectional view illustrating an OFF state of the conventional semiconductor device.

Next, a semiconductor device according to another preferred embodiment of the present invention will be described. FIG. 3 is a sectional view of the semiconductor device 2. Like the semiconductor device 1, the semiconductor device 2 includes a semiconductor substrate 10, a first epitaxial layer 11 and a second epitaxial layer 12. Source regions 13, base regions 14, base high concentration regions 16 and a drain region 15 are provided in the second epitaxial layer 12. Gate electrodes 21 are respectively embedded in trenches 20 provided in the second epitaxial layer 12. Further, buried insulating films 26 are respectively provided on the gate electrodes 21 to fill the trenches to the vicinities of opening edges of the trenches 20 for isolation between the gate electrodes 21 and the source electrodes 25. A source electrode 25 is provided over and in contact with upper surfaces of the buried insulating films 26, the source regions 13 and the base high concentration regions 16.

Unlike the interlayer insulating film 23 of the semiconductor device 1, the buried insulating films 26 of the semiconductor device 2 are provided at a level not higher than the upper surface of the second epitaxial layer 12. Therefore, there is no need to provide contact holes for electrically contacting the source electrode 25 to the source regions 13 and the base high concentration regions 16. As a result, microminiaturization can be achieved to locate the base high concentration regions 16 closer to the trenches 20. Therefore, even if the impurity concentration of the second epitaxial layer 12 is higher than in the semiconductor device 1, depletion layers 40 spreading from the base high concentration regions 16 disposed on opposite sides of each trench 20 are merged with each other at a position below the trench 20. Thus, the drain region 15 in the second epitaxial layer 12 is permitted to have a relatively low resistivity, thereby suppressing an increase in ON resistance.

The present invention is not limited to the embodiments described above, but any of various design modifications may be made within the purview defined by the claims. For example, the MOSFET configured along the side surfaces of the trenches is of the N type in the embodiments, but may be of a P type with the conductivity types of the respective regions being reversed.

While the embodiments of the present invention have been described in detail, it should be understood that these embodiments are merely illustrative of the technical principles of the present invention but not limitative of the invention. The spirit and scope of the present invention are to be limited only by the appended claims.

This application corresponds to Japanese Patent Application No. 2005-173243 filed in the Japanese Patent Office on Jun. 14, 2005, the disclosure of which is incorporated herein by reference.

What is claimed is:

1. A semiconductor device, comprising:
    a first epitaxial layer provided on a semiconductor substrate;
    a second epitaxial layer provided in contact with an upper surface of the first epitaxial layer and having a lower impurity concentration than the first epitaxial layer;
    a plurality of trenches provided in the second epitaxial layer as extending downward from an upper surface of the second epitaxial layer;
    a gate electrode embedded in each of the trenches;
    a source region extending downward from the upper surface of the second epitaxial layer along each of opposite side surfaces of the trench;
    a base region extending downward from a lower surface of the source region along each of the opposite side surfaces of the trench; and
    a base high concentration region provided adjacent the source region and the base region in spaced relation from the trench as extending downward from the upper surface of the second epitaxial layer to a depth that is greater than a depth of the base region and is smaller than a depth of the trenches, and having the same conductivity type as the base region and a higher impurity concentration than the base region.

2. The semiconductor device according to claim 1,
    wherein an interlayer insulating film is provided on the gate electrode as covering a part of the upper surface of the second epitaxial layer,
    wherein a source electrode is provided in contact with the interlayer insulating film, a part of the source region and an upper surface of the base high concentration region.

3. The semiconductor device according to claim 1,
    wherein a buried insulating film is provided on the gate electrode to fill the trench to the vicinity of an opening edge of the trench,
    wherein a source electrode is provided in contact with the buried insulating film, the source region and an upper surface of the base high concentration region.

* * * * *